(12) United States Patent
Jiang et al.

(10) Patent No.: US 8,384,100 B2
(45) Date of Patent: Feb. 26, 2013

(54) INGAAIN LIGHT-EMITTING DEVICE AND MANUFACTURING METHOD THEREOF

(75) Inventors: Fengyi Jiang, Nanchang (CN); Li Wang, Nanchang (CN); Chuanbing Xiong, Nanchang (CN); Wenqing Fang, Nanchang (CN); Hechu Liu, Nanchang (CN); Maoxing Zhou, Nanchang (CN)

(73) Assignee: Lattice Power (JIANGXI) Corporation, Nanchang (CN)

( * ) Notice: Subject to any disclaimer, the term of this patent is extended or adjusted under 35 U.S.C. 154(b) by 171 days.

(21) Appl. No.: 11/915,304

(22) PCT Filed: May 26, 2006

(86) PCT No.: PCT/CN2006/001100
§ 371 (c)(1),
(2), (4) Date: Sep. 24, 2008

(87) PCT Pub. No.: WO2006/125396
PCT Pub. Date: Nov. 30, 2006

(65) Prior Publication Data
US 2009/0026473 A1    Jan. 29, 2009

(30) Foreign Application Priority Data

May 27, 2005 (CN) .......................... 2005 1 0026306

(51) Int. Cl.
*H01L 21/00* (2006.01)

(52) U.S. Cl. ............ 257/96; 438/47; 257/E33.026; 257/E33.062

(58) Field of Classification Search .......... 257/103, 257/E21.127; 438/22, 46
See application file for complete search history.

(56) References Cited

U.S. PATENT DOCUMENTS

| | | | |
|---|---|---|---|
| 6,642,092 B1 * | 11/2003 | Voutsas et al. | 438/166 |
| 6,869,820 B2 * | 3/2005 | Chen | 438/79 |
| 6,919,585 B2 * | 7/2005 | Liu | 257/97 |
| 2002/0070383 A1 * | 6/2002 | Shibata et al. | 257/76 |
| 2003/0092263 A1 * | 5/2003 | Koike et al. | 438/689 |
| 2003/0173574 A1 * | 9/2003 | Koide et al. | 257/94 |
| 2004/0206963 A1 * | 10/2004 | Chang et al. | 257/79 |
| 2004/0231590 A1 * | 11/2004 | Ovshinsky | 118/718 |
| 2005/0048739 A1 * | 3/2005 | Kerdiles et al. | 438/458 |
| 2005/0110037 A1 * | 5/2005 | Takeda et al. | 257/103 |
| 2005/0142677 A1 * | 6/2005 | Kon et al. | 438/22 |
| 2006/0145187 A1 * | 7/2006 | Kim et al. | 257/190 |
| 2006/0261367 A1 * | 11/2006 | Lee et al. | 257/103 |
| 2007/0072324 A1 * | 3/2007 | Krames et al. | 438/46 |
| 2009/0263925 A1 * | 10/2009 | Kunisato et al. | 438/42 |

* cited by examiner

*Primary Examiner* — Julio J Maldonado
*Assistant Examiner* — Sonya D McCall-Shepard
(74) *Attorney, Agent, or Firm* — Shun Yao; Park, Vaughan, Fleming & Dowler LLP

(57) ABSTRACT

There is provided an InGaAlN light-emitting device and a manufacturing method thereof. The light emitting device includes a conductive substrate having a main surface and a back surface, a metal bonding layer formed on the main surface of the substrate, a light reflecting layer formed on the bonding layer, a semiconductor multilayer structure including at least a p-type and an n-type InGaAlN layer disposed on the reflecting layer, the p-type InGaAlN layer directly contacting the reflecting layer, and ohmic electrodes disposed on said n-type InGaAlN layer and on the back surface of the conductive substrate, respectively.

9 Claims, 2 Drawing Sheets

InGaAlN LIGHT-EMITTING DEVICE AND MANUFACTURING METHOD THEREOF

RELATED APPLICATION

This application is a national-stage application of and hereby claims priority under 35 U.S.C. § 371 to the PCT Application No. PCT/CN2006/001100, filed 26 May 2006, which claims priority to China Patent Application No. 200510026306.5, filed 27 May 2005.

TECHNOLOGY FIELD

The present invention relates to a type of indium gallium aluminum nitride ($In_xGa_yAl_{1-x-y}N$, $0<=x<=1$, $0<=y<=1$) light-emitting device and manufacturing method thereof.

BACKGROUND TECHNOLOGIES

Indium gallium aluminum nitride ($In_xGa_yAl_{1-x-y}N$, $0<=x<=1$, $0<=y<=1$) is one of the optimal materials for manufacturing short-wavelength light-emitting devices. Recently, many new light-emitting devices have been manufactured using InGaAlN materials, such as blue, green, ultraviolet, and white light-emitting diodes (LEDs). The existing technologies indicate that the majority of the InGaAlN light-emitting products are manufactured on sapphire substrates. Currently, these technologies are publicly available. For example, Japanese patent JP2737053 discloses a method for fabricating GaN light-emitting devices on a sapphire substrate. Because sapphire is an insulator, it is required that the two electrodes of an InGaAlN light-emitting device manufactured on a sapphire substrate be positioned on the same side of the chip. As a result, the chip fabrication process is more complex, with increased packaging difficulty. In addition, the product yield is reduced. Consequently, the device reliability is lessened and the product costs are increased. Furthermore, the thermal conductivity of sapphire is low. If high-power devices are desired, heat dissipation remains an issue. One solution is to use SiC substrate to fabricate GaN materials based on the fact that SiC is electrically conductive and has a high thermal conductivity. Hence, technically, using SiC substrates can solve the aforementioned problems. U.S. Pat. No. 5,686,738 discloses a method for fabricating InGaAlN light-emitting devices on SiC substrates. However, SiC substrates are very expensive, which results in high costs if they are used in manufacturing InGaAlN materials. Therefore, from a production-cost point of view, SiC substrates are not suitable for high-volume production. Another solution is to fabricate InGaAlN materials on silicon substrates. Since silicon is a well-tested semiconductor material with low costs and high thermal conductivity, and silicon-processing techniques are mature, using silicon substrate in manufacturing InGaAlN light-emitting devices can not only facilitate a vertical-electrode device structure, but also significantly reduces the costs. However, since the band gap of silicon is fairly narrow and silicon exhibits considerable absorption of visible light, InGaAlN light-emitting devices directly fabricated on a silicon substrate exhibit low luminescence efficiency due to absorption of light by the substrate. Another solution available in the existing technologies is to bond a conductive substrate to the InGaAlN material fabricated on a sapphire substrate. The sapphire substrate is subsequently removed, and electrodes can then be placed on both sides of the substrate. Nevertheless, since sapphire is very hard and resistant to acid or base corrosion, it is very difficult to remove a sapphire substrate. Although laser-lift-off technologies can be used to remove sapphire substrates, the product yield and manufacturing efficiency remain low. The laser-lift-off process can also cause certain damage to the InGaAlN material. Therefore, it is difficult to apply this method to volume production.

CONTENT OF THE INVENTION

One purpose of the present invention is to provide a type of InGaAlN light-emitting device. Such devices have vertical electrode structures, which reduces the manufacturing costs and increases the luminance efficiency. Another purpose of the present invention is to provide a method for fabricating InGaAlN light-emitting devices with the aforementioned vertical electrode structure. According to this method, a layered InGaAlN semiconductor structure is grown on a silicon substrate. Subsequently, the layered InGaAlN semiconductor structure is bonded to another conductive substrate. A low-cost manufacturing process is used to remove the silicon growth substrate and complete the manufacturing of the light-emitting device. The method disclosed herein simplifies the manufacturing process and reduces the manufacturing costs.

The structure of a light-emitting device fabricated in accordance with one embodiment of the present invention includes a conductive substrate with a main surface and a back surface. The structure further includes a metal bonding layer on the main surface of the conductive substrate. In addition, the structure includes a light-reflection layer on the metal bonding layer. The structure also includes an $In_xGa_yAl_{1-x-y}N$, $0<=x<=1$, $0<=y<=1$ multilayer structure which includes at least a p-type and an n-type layer on the light-reflection layer. The p-type InGaAlN semiconductor material has direct contact with the light-reflection layer. Furthermore, ohmic contacts are respectively fabricated on the $In_xGa_yAl_{1-x-y}N$ multilayer structure and on the back surface of the conductive substrate.

A method for manufacturing a light-emitting device, comprising the following steps:

(a) fabricating an $In_xGa_yAl_{1-x-y}N$ ($0<=x<=1$, $0<=y<=1$) semiconductor multilayer structure which includes at least a p-type and an n-type layer on a (111) silicon growth substrate. The multilayer $In_xGa_yAl_{1-x-y}N$ semiconductor material (22-26) includes an AlN buffer layer (22), an n-type GaN layer (24), a GaN/InGaN multi-quantum-well layer (25), and a p-type GaN layer (26). The outermost layer is p-type layer (26). An undoped GaN layer (23) can be placed between AlN buffer layer (22) and the n-type GaN layer (24). The AlN buffer layer can be doped or undoped;

(b) forming a light-reflection layer and a metal bonding layer on the $In_xGa_yAl_{1-x-y}N$ multilayer structure;

(c) bonding the main surface of a conductive substrate with the aforementioned metal bonding layer;

(d) removing the silicon (111) growth substrate, the AlN buffer layer and the undoped GaN layer to expose the n-type InGaAlN layer;

(e) forming a respective ohmic contact on each of the n-type InGaAlN layer and the back surface of the conductive substrate.

A light-emitting device manufactured in accordance with one embodiment of the present invention has a reliable vertical electrode structure, which simplifies the manufacturing process of the chip, reduces the complexity of packaging, increases the product yield and yield, and reduces the manufacturing costs.

The present invention discloses a method for fabricating multilayer $In_xGa_yAl_{1-x-y}N$ semiconductor material on a silicon substrate. Because silicon substrates can facilitate highquality InGaAlN fabrication, can be easily removed, and are inexpensive, the present method can facilitate large-scale production and lower product costs.

DETAILED EMBODIMENTS

Figure 1:
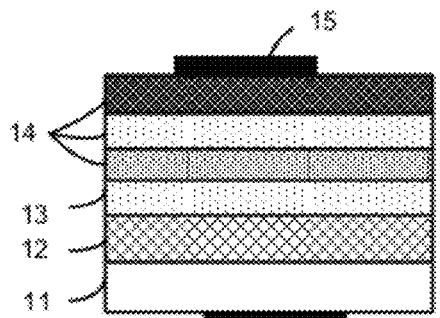
FIG. 1 is a cross-sectional view depicting a light-emitting device with a vertical electrode configuration in accordance with one embodiment of the present invention.

The following sections provide detailed description of the present invention in conjunction with the figures and embodiments.

The labels in FIGS. 1 to 5 are defined as follows:

Element 11 is a conductive substrate, element 12 is a metal bonding layer, element 13 is a light-reflection layer 13, element 14 is a $In_xGa_yAl_{1-x-y}N$ semiconductor multilayer structure, elements 15 and 16 are electrodes, element 21 is a silicon substrate, element 22 is an AlN buffer layer, element 23 is an undoped GaN layer, element 24 is an n-type GaN layer, element 25 is a GaN/InGaN multi-quantum-well, element 26 is a p-type GaN layer, element 27 is a light-reflection layer, element 28 is a bonding layer, element 31 is a conductive layer, element 32 is an ohmic contact layer, element 33 is a bonding layer 33, and elements C1 and C2 are electrodes.

As illustrated in FIG. 1, in accordance with one embodiment of the present invention, the present inventive $In_xGa_yAl_{1-x-y}N$ light-emitting device includes a conductive substrate 11; above this substrate are a bonding metal layer 12 and a light-reflection layer 13. Above said light-reflection layer is an InGaAlN semiconductor multilayer structure 14. The bottom layer of said InGaAlN multilayer structure is a p-type layer, and the top layer is an n-type layer. The top surface of the InGaAlN material is an N-face. Ohmic contacts 15 and 16 are respectively formed above $In_xGa_yAl_{1-x-y}N$ multiplayer structure 14 and beneath conductive substrate 11.

The material used for conductive substrate 11 can be any type of semiconductor or metal material. Considering electrical and thermal conductivity, manufacturability, and costs, well established semiconductor material, such as silicon, and common metals, such as copper, stainless steel, silver, and kovar (a nickel-cobalt ferrous alloy). Since $In_xGa_yAl_{1-x-y}N$ material bonds poorly with conductive substrate 11, bonding layer 12 is added between substrate 11 and InGaAlN structure 14. Bonding layer 12 not only has good bonding capabilities but also forms a good ohmic contact with conductive substrate 11. Furthermore, bonding layer 12 ideally can sustain subsequent fabrication processes and remain damage-free. Bonding layer 12 can be a single layer or a multilayer structure. Since conductive substrate 11 exhibits a high carrier density, there is a wide range of selection for the metal for bonding layer 12 so long as the metal has good bonding capabilities and exhibits good reliability. In order to create a reliable bonding, a metal used for the bonding layer ideally has a low melting point. For example, one can select gold (Au), zinc (Zn), indium (In), tin (Sn), palladium (Pd), and alloys thereof. Considering the effect of diffusion between metal layers on the ohmic contact and the stability of the metal during fabrication processes, it is preferable to use gold or gold alloys, such as gold-zinc and gold-tin alloys, as the bonding metal.

Since metals such as Ni, Au has poor reflectivity, such metal layers reflect poorly the light produced by InGaAlN multilayer structure 14. As a result, the light extraction efficiency is lowered. Therefore, one can insert a light-reflection layer between bonding metal layer 12 and InGaAlN multilayer structure 14. As described above, the bottom layer of the present inventive InGaAlN multilayer structure is a p-type layer. Therefore, light-reflection layer 13 ideally forms a good ohmic contact with a p-type InGaAlN material. In one embodiment of the present invention, this light-reflection layer 13 is platinum (Pt), because Pt not only forms a good ohmic contact with p-type InGaAlN material, but also exhibits its a high reflectivity to visible light. Meanwhile, Pt is also very stable. To achieve electroluminescence, InGaAlN multilayer structure 14 contains at least one n-type layer and one p-type layer. To increase the luminescence efficiency, typically a double hetero junction or a multi-quantum-well structure is inserted between the n-type layer and p-type layer. The InGaAlN multilayer structure can also employ any publicly available structure. The proportion of In, Ga, and Al in the luminescent layer 14 can vary between 0-1, which allows adjustment of the device's luminescence wavelength.

An $In_xGa_yAl_{1-x-y}N$ light-emitting device 14 manufactured in accordance with one embodiment of the present invention exhibits a nitrogen-atom upper surface, which allows the InGaAlN material to be removed using chemical etching and avoids the use of Inductively Coupled Plasma (ICP) etching system. Hence, chemical etching can be used to coarsen the device surface, which can improve the light-extraction efficiency.

The ohmic electrode 15 on InGaAlN multilayer structure 14 can be based on Au—Ge—Ni alloy or metals with a small work function, such as Ti and Al. In principle, any metal can be used if the doping density is sufficiently high. In one embodiment of the present invention, a Au—Ge—Ni alloy is used to form ohmic contact 15, since Au—Ge—Ni alloy exhibits good stability, resistance to corrosion, and resistance to oxidization. In addition, any metal can be used to form ohmic contact 16 on the back surface of conductive substrate 16, since this conductive substrate is configured with a high carrier density. In one embodiment of the present invention, Au, Ni—Au alloy, and/or Ti—Au alloy can be used for the electrode.

A method for manufacturing a light-emitting device, comprising:

A multilayer $In_xGa_yAl_{1-x-y}N$ multilayer structure 22-26 is fabricated on a (111) silicon substrate 21. The fabrication can use any publicly available deposition process, such as Chemical Vapor Deposition and Molecular Beam Epitaxy. The fabrication process of InGaAlN can be based on any publicly available approach. In one embodiment of the present invention, $In_xGa_yAl_{1-x-y}N$ multilayer structure 22-26 is fabricated in the following order: AlN buffer layer 22, undoped GaN layer 23, silicon-doped GaN (n-type) layer 24, GaN/InGaN multi-quantum-well layer 25, and magnesium-doped (p-type) layer 26. The surface of silicon substrate 21 is engraved with grooves to release the stress created by lattice and thermal mismatch between silicon substrate 21 and $In_x$-$Ga_yAl_{1-x-y}N$ multilayer structure 22-26 and to prevent cracks.

Upon completion of the fabrication of multilayer $In_x$-$Ga_yAl_{1-x-y}N$ semiconductor material 22-26, an annealing process is performed to activate the p-type dopants. A light-reflection layer 27 is built on top of the p-type layer of multilayer $In_xGa_yAl_{1-x-y}N$ semiconductor material 22-26. At the same time, this light-reflection layer also forms a good ohmic contact to the p-type layer. In one embodiment of the present invention, platinum is used for light-reflection layer 27. To improve the ohmic-contact properties, this electrode layer needs to undergo an annealing process so it can be alloyed. Above light-reflection layer 27 a metal bonding layer 28 is formed. In theory, any metal can be used for bonding layer 28. However, in order to create a reliable bonding, one can use a metal of which the melting point is not very high. Embodiments of the present invention use low-melting-point alloys such as Au—Zn, Au—Sn, and Au—In alloy, as well as pure Au. Bonding layer 28 can be a single-layer or multilayer structure. Light-reflection layer 27 and metal bonding layer 28 can be stacked together and then be alloyed.

At the same time, an ohmic contact layer 32 can be formed on top of a conductive substrate 31. Depending on the electric conductivity of a silicon substrate, metal materials such as nickel, gold, platinum, and titanium can be used for forming a single or multilayer ohmic contact 32. Subsequently, metal bonding layer 33 is formed on ohmic contact layer 32. The material-selection criteria for bonding layer 33 are similar to those for bonding layer 28. It may not be necessary to fabricate ohmic contact layer 32 and bonding layer 33 if conductive substrate 31 is a low-melting-point metal. If this is the case, the ohmic-contact layer can by used directly as the bonding layer 33. Metal bonding layer 33 can be constructed using electron beam evaporation, magnetron sputtering or any other metal deposition methods. Bonding layer 28 is then bonded with conductive substrate 31 after the formation of metal bonding layer 33. In one embodiment of the present invention, the two bonding layers are bonded after being placed under a certain pressure in a given temperature for a predetermined period of time.

After bonding, silicon substrate 21 is removed. Silicon substrate 21 can be removed by using a technique such as mechanical grinding, dry etching, chemical etching or any combination of the above methods. In one embodiment of the present invention, the silicon substrate is removed by chemical etching using a solution based on hydrofluoric acid, nitric acid, and acetic acid.

The InGaAlN material is exposed after silicon substrate 21 is removed. Because AlN buffer layer 22 and undoped GaN layer 23 may impede the formation of good ohmic contact, they are ideally removed in order to expose n-type layer 24 which has high carrier density and to form an ohmic contact on the exposed n-type layer 24. Methods for removing AlN buffer layer 22 and undoped GaN layer 23 include dry etching techniques such as reactive ion etching (RIE) and ICP etching system, as well as wet etching techniques based on concentrated phosphoric acid or alkali etching. Next, an ohmic contact layer C1 is formed on n-type GaN layer 24, and an ohmic contact layer C2 is formed on conductive substrate 31. This way, an InGaAlN light-emitting device with a vertical electrode structure in accordance with one embodiment of the present invention is obtained.

The following three examples further illustrate the method disclosed in the present invention.

EXAMPLE 1

Figure 2:
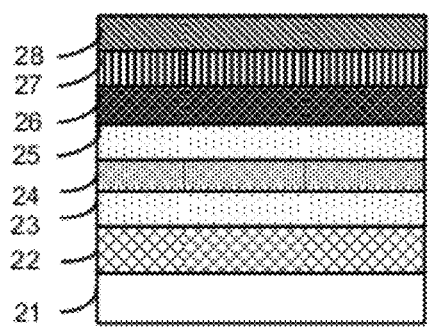
FIG. 2 is a cross-sectional view representing an $In_xGa_yAl_{1-x-y}N$ multilayer fabricated on a silicon growth substrate, a light-reflection layer and a metal bonding layer in accordance with one embodiment of the present invention.
Figures 1, 2:
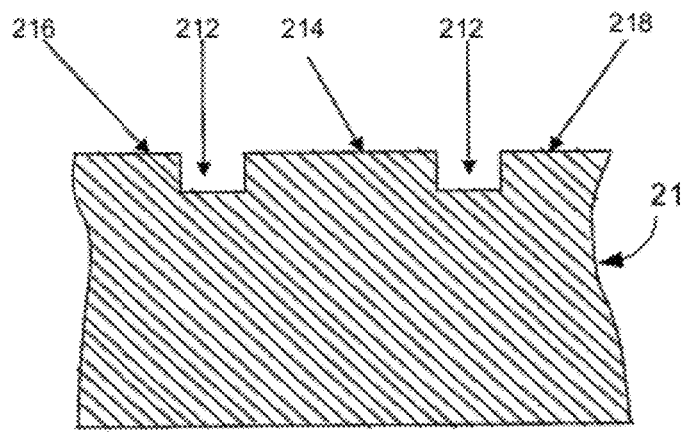
Figure 3:
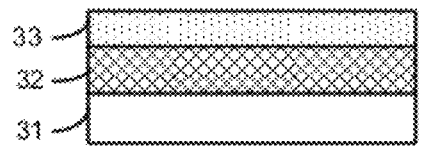
FIG. 3 is a cross-sectional view of a metal bonding layer and a conductive substrate in accordance with one embodiment of the present invention.
Figure 4:
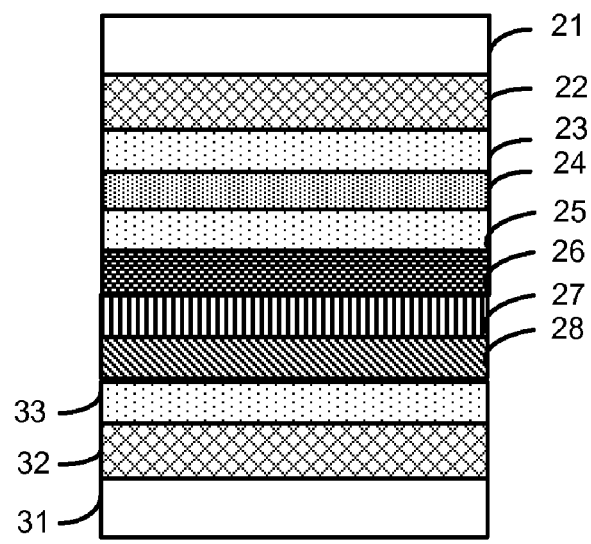
FIG. 4 is a cross-sectional view of a chip obtained by bonding the $In_xGa_yAl_{1-x-y}N$ epitaxial structure as shown in FIG. 2 with the metal bonding layer as shown in FIG. 3 in accordance with one embodiment of the present invention.
Figure 5:
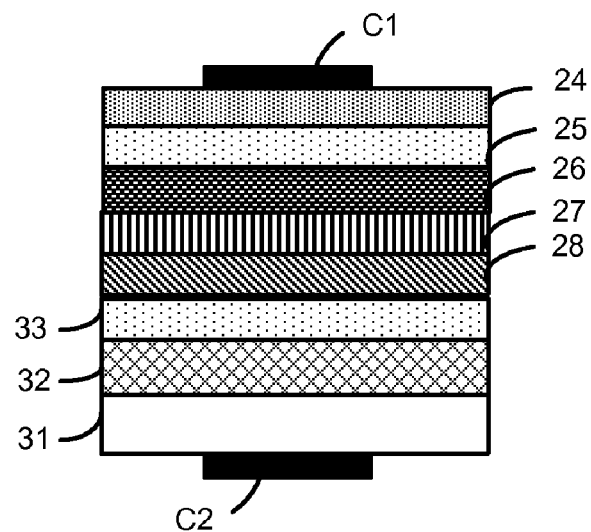
FIG. 5 is a cross-sectional view of a light-emitting device obtained after removing the growth substrate from the multilayer structure as shown in FIG. 4 in accordance with one embodiment of the present invention.

Referring to FIG. 2, the fabrication of a light-emitting device starts with preparing a 2-inch silicon (111) substrate 21. Using Chemical Vapor Deposition, multilayer $In_xGa_yAl_{1-x-y}N$ semiconductor material 22-26 is fabricated in the following order: AlN buffer layer 22, undoped GaN layer 23, silicon-doped n-type GaN layer 24, five-period GaN/InGaN multi-quantum-well layer 25, and magnesium-doped p-type layer 26. Upon completion, the wafer is annealed in a nitrogen environment at 700° C. for approximately 30 minutes to activate the Mg dopant. Subsequently, a platinum layer 27, approximately 50 nanometers thick, and a gold layer 28, approximately 1000 nanometers thick, are deposited on the p-type layer using electron beam evaporation. Referring to FIG. 3, a nickel layer 32, approximately 100 nanometers thick, and a gold layer 33, approximately 1000 nanometers thick, are formed on silicon (111) substrate 31. Subsequent to the deposition, the wafer on which the InGaAlN thin films are epitaxially grown is bonded with the silicon (111) substrate on which nickel and gold has been deposited. This bonding process is performed under a pressure of 600 kg at 300° C., which facilitates a strong bond. A structure as shown in FIG. 4 is then obtained. The bonded wafers are then placed in a solution that includes hydrofluoric acid, nitric acid, and acetic acid until the silicon growth substrate is completely removed. Note that, prior to the chemical etching, a nickel/gold protection thin film is formed on the back surface of substrate 31 to protect substrate 31 from being chemically etched. After chemical etching, the InGaAlN thin films are exposed. The outermost layer is AlN buffer layer 22. AlN buffer layer 22 and undoped GaN layer 23 are then removed by chemical etching based on concentrated phosphoric acid. Next, a layer of gold-germanium-nickel alloy, approximately 100 nanometers thick, is deposited on n-type GaN layer 24. After the deposition process, the structure is placed in a chamber with nitrogen gas at 300° C. for 3 minutes to form an alloy. In addition, a layer of gold, approximately 1000 nanometers thick, is deposited on the layer of gold-germanium-nickel alloy. Electrode C1 with a diameter of approximately 100 microns is then formed by photo lithography. Electrode C2 is formed on the back surface of substrate 31 by photo lithography. The wafer is then diced into 1000 micron X 1000 micron chips. After wire bonding and packaging, light-emitting devices as shown in FIG. 5 are obtained.

EXAMPLE 2

Referring to FIG. 2, the fabrication of a light-emitting device starts with preparing a 2-inch silicon (111) substrate. A number of 10-nanometer-deep grooves with a crisscross pattern are created on the silicon substrate by using photo lithography and ICP etching, thereby forming a number of square-shaped mesas approximately 350 micron X 350 micron in size. Using Chemical Vapor Deposition, an $In_xGa_yAl_{1-x-y}N$ multilayer structure is fabricated in the following order: an AlN buffer layer, an undoped GaN layer, a silicon-doped n-type GaN layer, a five-period GaN/InGaN multi-quantum-well layer, and a magnesium-doped p-type layer. Upon completion of the fabrication of these layers, to the wafer is annealed in a nitrogen environment at 700° C. for approximately 20 minutes to activate the Mg dopant. Subsequently, a platinum layer, approximately 100 nanometers thick, a gold layer, approximately 500 nanometers thick, and a gold-zinc alloy layer, approximately 200 nanometers thick, are deposited on the p-type layer by using electron beam evaporation. A platinum layer, approximately 50 nanometers thick, a gold layer, approximately 500 nanometers thick, and a layer of gold-indium alloy, approximately 100 nanometers thick, are fabricated on both sides of a conductive silicon (100) substrate. After the deposition, the wafer on which the InGaAlN thin films are epitaxially grown is bonded with the silicon (100) substrate on which only metal layers are deposited. The bonding process is performed under a pressure of 800 kg at 260° C. Subsequently, the silicon (111) substrate is removed using ICP etching to expose the InGaAlN thin films. The outermost layer is the AlN buffer layer. Next, the AlN buffer layer and the undoped GaN layer are completely removed using ICP etching. A titanium layer, approximately 50 nanometers thick, and an aluminum layer, approximately 100 nanometers thick, are deposited the n-type GaN layer. After the deposition process, the wafer is then placed in a chamber with nitrogen gas at 500° C. for 3 minutes to form an alloy. In addition, a titanium layer, approximately 10 nanometers thick, and a gold layer, approximately 1200 nanometers thick, are deposited on the titanium/aluminum electrode. Subsequently, square-shaped electrodes with each side of 100 microns are formed by photo lithography. Furthermore, the wafer is diced along the pre-formed grooves, after which individual light-emitting chips can be obtained. After wire-bonding and packaging, light-emitting devices in accordance to one embodiment of the present invention are obtained.

EXAMPLE 3

On a 2-inch silicon (111) substrate, using Chemical Vapor Deposition, an $In_xGa_yAl_{1-x-y}N$ multilayer structure is fabricated in the following order: an AlN buffer layer, an undoped GaN layer, a silicon-doped GaN n-type layer, a five-period GaN/InGaN multi-quantum-well layer, and a magnesium-doped p-type layer. Upon completion of the fabrication of these layers, the wafer is annealed in a nitrogen environment at 700° C. for 30 minutes to activate the Mg dopant. Subsequently, a platinum layer, approximately 5 nanometers thick, a nickel layer, approximately 5 nanometers thick, and a gold layer, approximately 10 nanometers thick, are deposited on the p-type layer by using electron beam evaporation. After the deposition process, the structure is placed in a chamber with a nitrogen-oxygen mixture gas at 550° C. for 3 minutes to form an alloy. Subsequently, a gold layer, approximately 500 nanometers thick, is deposited on the alloy. A gold-tin alloy, approximately 500 nanometers thick, is formed on a polished copper substrate. The wafer on which the InGaAlN thin films are epitaxitially grown is bonded with the copper substrate on which the gold-tin alloy is deposited under 500 kg of pressure, at 300° C. Next, ICP etching is used to completely remove the silicon substrate, the AlN buffer layer, and the un-doped GaN layer. A layer of gold-germanium-nickel alloy, approximately 100 nanometers thick, is then deposited on the n-type GaN layer. After the deposition process, the structure is then placed in a chamber with nitrogen gas at 300° C. for 3 minutes to form an alloy. In addition, a gold layer, approximately 100 nanometers thick, is deposited on the gold-germanium-nickel electrode layer. After photo lithography, an electrode is formed with a diameter of approximately 80 microns. After the wafer is diced into 200 micron X 200 micron chips, wire bonding, and packaging, light-emitting devices in accordance with one embodiment of the present invention are obtained.

What is claimed is:
1. An $In_xGa_yAl_{1-x-y}N$ ($0<=x<=1$, $0<=y<=1$) light-emitting device, the device comprising:
a conductive substrate configured with a front surface and a back surface, wherein the conductive substrate comprises a conductive Si substrate having a crystal orientation of (100), and wherein both sides of the conductive Si substrate are deposited with an ohmic contact layer stack comprising: a Pt layer, a Au layer, and a Au—In alloy layer;
a metal bonding layer situated on the front surface of the conductive substrate;
a light-reflection layer situated on the metal bonding layer;
an $In_xGa_yAl_{1-x-y}N$ ($0<=x<=1$, $0<=y<=1$) semiconductor multilayer structure situated on the light-reflection layer, wherein the $In_xGa_yAl_{1-x-y}N$ multilayer structure comprises at least one p-type layer and one n-type layer, and wherein the p-type layer is coupled to the light-reflection layer; and wherein the conductive substrate is electrically coupled to the p-type layer via the light-reflection layer and the metal bonding layer; and
two electrodes, wherein one electrode is situated on the $In_xGa_yAl_{1-x-y}N$ semiconductor multilayer structure, and the other electrode is in direct contact with the back surface of the conductive substrate.

2. The $In_xGa_yAl_{1-x-y}N$ ($0<=x<=1$, $0<=y<=1$) light-emitting device of claim 1, wherein the light-reflection layer comprises at least a platinum layer.

3. The $In_xGa_yAl_{1-x-y}N$ ($0<=x<=1$, $0<=y<=1$) light-emitting device of claim 1, wherein the ohmic electrode on the InGaAlN semiconductor multilayer structure comprises a gold-germanium-nickel alloy.

4. The light-emitting device of claim 1, wherein the conductive substrate comprises at least one of: copper, silver, nickel-cobalt ferrous alloy, and stainless steel.

5. The $In_xGa_yAl_{1-x-y}N$ ($0<=x<=1$, $0<=y<=1$) light-emitting device of claim 1, wherein the InGaA1N semiconductor multilayer structure is configured such that the side of the InGaA1N semiconductor multilayer structure which is situated closer to the conductive substrate exhibits a Ga-face, and the side of the InGaA1N semiconductor multilayer structure which is situated farther from the conductive substrate exhibits an N-face.

6. A method for manufacturing a light-emitting device, the method comprising:
(a) fabricating a an $In_xGa_yAl_{1-x-y}N$ ($0<=x<=1$, $0<=y<=1$) semiconductor multilayer structure which comprises at least an n-type layer and a p-type layer on a silicon growth substrate;
wherein the $In_xGa_yAl_{1-x-y}N$ ($0<=x<=1$, $0<=y<=1$) semiconductor multilayer structure includes a AlN buffer layer, an n-type GaN layer, a GaN/InGaN multi-quantum-well layer, and a p-type GaN layer;
wherein the outermost layer is the p-type layer;
wherein between the AlN buffer layer, which is in contact with the growth substrate, and the n-type GaN layer is an undoped GaN layer; and
wherein the AlN buffer layer can be doped or undoped;
(b) forming first a light-reflection layer and then a metal bonding layer on the surface of the $In_xGa_yAl_{1-x-y}N$ semiconductor multilayer structure;
(c) bonding the main surface of a conductive substrate with the first metal bonding layer; wherein the conductive substrate comprises a conductive Si substrate having a crystal orientation of 100, and wherein both sides of the conductive Si substrate are deposited with an ohmic contact layer stack comprising: a Pt layer, a Au layer, and a Au-In alloy layer, and wherein the conductive substrate is electrically coupled to the p-type layer via the light-reflection layer and the first metal bonding layer;
(d) removing the silicon growth substrate, AlN buffer layer, and undoped GaN layer situated between the AlN buffer layer, which is in contact with the growth substrate, and the n-type GaN layer to expose the n-type layer; and (e) forming electrodes on the n-type layer and the back surface of the conductive substrate, respectively.

7. The method of claim 6, further comprising patterning the silicon growth substrate by forming grooves and mesas thereon prior to fabricating the $In_xGa_yAl_{1-x-y}N$ semiconductor multilayer structure.

8. The method of claim 6, further comprising forming an ohmic contact layer and/or a second metal bonding layer on the main surface of the conductive substrate prior to bonding the conductive substrate with the first metal bonding layer.

9. The method of claim 6,
wherein the silicon growth substrate is removed using an etching solution comprising nitric acid, hydrofluoric acid, and acetic acid; and
wherein removing the AlN buffer layer and undoped GaN layer comprises using dry etching techniques such as reactive ion etching and ICP etching, or wet etching techniques using concentrated phosphoric acid or alkali.

* * * * *